US010283559B2

(12) United States Patent
Storm et al.

(10) Patent No.: US 10,283,559 B2
(45) Date of Patent: May 7, 2019

(54) PIXEL CIRCUIT

(71) Applicants: STMicroelectronics (Grenoble 2) SAS, Grenoble (FR); STMicroelectronics (Research & Development) Limited, Marlow, Buckinghamshire (GB)

(72) Inventors: Graeme Storm, Kirkliston (GB); Christophe Mandier, Grenoble (FR)

(73) Assignees: STMicroelectronics (Grenoble 2) SAS, Grenoble (FR); STMicroelectronics (Research & Development) Limited, Marlow (GB)

( * ) Notice: Subject to any disclaimer, the term of this patent is extended or adjusted under 35 U.S.C. 154(b) by 0 days.

(21) Appl. No.: 15/640,968

(22) Filed: Jul. 3, 2017

(65) Prior Publication Data

US 2017/0317138 A1 Nov. 2, 2017

Related U.S. Application Data

(62) Division of application No. 14/988,376, filed on Jan. 5, 2016, now Pat. No. 9,881,968, which is a division
(Continued)

(30) Foreign Application Priority Data

Aug. 9, 2013 (GB) .................................. 1314288.0

(51) Int. Cl.
*H01L 27/148* (2006.01)
*H04N 5/355* (2011.01)
(Continued)

(52) U.S. Cl.
CPC .. *H01L 27/14812* (2013.01); *H01L 27/14638* (2013.01); *H01L 27/14643* (2013.01);
(Continued)

(58) Field of Classification Search
CPC ......... H01L 27/14603; H01L 27/14609; H01L 27/14643; H01L 27/14612; H01L 27/146
See application file for complete search history.

(56) References Cited

U.S. PATENT DOCUMENTS 6,043,478 A 3/2000 Wang
6,664,530 B2 12/2003 Simony
(Continued)

FOREIGN PATENT DOCUMENTS

WO WO-9952273 A1 10/1999

OTHER PUBLICATIONS

UK-IPO Search Report and Written Opinion for GB 1314288.0 dated Jan. 20, 2014 (6 pages).

*Primary Examiner* — Marc Anthony Armand
*Assistant Examiner* — Quinton A Brasfield
(74) *Attorney, Agent, or Firm* — Crowe & Dunlevy

(57) ABSTRACT

A pixel arrangement includes a photodiode, a reset transistor configured to be controlled by a reset signal and coupled to a reset input voltage, a transfer gate transistor configured to transfer charge from the photodiode to a node, wherein the transfer gate transistor is controlled by a transfer gate voltage, and a source follower transistor controlled by the voltage on the node and coupled to a source follower voltage. A capacitor is coupled between the node and an input voltage. During a read operation the input voltage is increased to boost the voltage at the node. The increased input voltage may, for example, be one the reset input voltage, said source follower voltage, said transfer gate voltage and a boosting voltage.

15 Claims, 12 Drawing Sheets

Related U.S. Application Data of application No. 14/454,776, filed on Aug. 8, 2014, now Pat. No. 9,728,578.

(51) Int. Cl.
*H04N 5/359* (2011.01)
*H04N 5/3745* (2011.01)
*H01L 27/146* (2006.01)

(52) U.S. Cl.
CPC ........... *H04N 5/355* (2013.01); *H04N 5/3559* (2013.01); *H04N 5/3597* (2013.01); *H04N 5/37452* (2013.01); *H01L 27/14609* (2013.01)

(56) References Cited

U.S. PATENT DOCUMENTS

| | | |
|---|---|---|
| 2005/0083421 A1 | 4/2005 | Berezin et al. |
| 2005/0121519 A1 | 6/2005 | Shinohara |
| 2006/0018152 A1* | 1/2006 | Kawai ................. G11C 11/5628 365/185.03 |
| 2006/0044889 A1 | 3/2006 | Takahashi et al. |
| 2006/0261431 A1 | 11/2006 | Kim et al. |
| 2008/0093534 A1 | 4/2008 | Mheen et al. |
| 2008/0094483 A1 | 4/2008 | Fossum |
| 2009/0153715 A1 | 6/2009 | Deschamps et al. |
| 2009/0200454 A1 | 8/2009 | Barbier et al. |
| 2011/0042551 A1* | 2/2011 | Ha ..................... H01L 27/14609 250/208.1 |
| 2011/0045629 A1* | 2/2011 | Ohkawa ............ H01L 27/14601 438/87 |
| 2011/0068381 A1* | 3/2011 | Barbier ............... H01L 27/14609 257/292 |
| 2011/0128426 A1 | 6/2011 | Taruki et al. |
| 2011/0216231 A1 | 9/2011 | Fowler |
| 2011/0316839 A1* | 12/2011 | Minowa ............ H01L 27/14609 345/211 |
| 2012/0312963 A1 | 12/2012 | Storm et al. |
| 2013/0015324 A1 | 1/2013 | Park et al. |

\* cited by examiner

PIXEL CIRCUIT

CROSS-REFERENCE TO RELATED APPLICATIONS

This application is a divisional application from U.S. patent application Ser. No. 14/988,376 filed Jan. 5, 2016, which is a divisional application from U.S. application Ser. No. 14/454,776 filed Aug. 8, 2014, both claiming priority from Great Britain Application for Patent No. 1314288.0 filed Aug. 9, 2013, the disclosures of all of which are incorporated by reference.

TECHNICAL FIELD

Some embodiments relate to a pixel and in particular but not exclusively to a pixel structure for use in an array of pixels.

BACKGROUND

Image sensors using photodiode pixels, typically implemented in CMOS architecture, are well known. Such image sensors in many applications may have the image sensitive element and the image processing circuitry embodied in a single chip which can be manufactured using CMOS techniques.

SUMMARY

According to an aspect, there is provided a pixel arrangement comprising: at least one photodiode; at least one reset transistor configured to be controlled by a reset signal and coupled in use to a reset input voltage; a transfer gate transistor for each photodiode configured to transfer charge from the photodiode to a node in use, said transfer gate transistor configured to be controlled by a transfer gate voltage, and at least one source follower transistor configured to be controlled by the voltage on the node and coupled in use to a source follower voltage, wherein during a read operation, at least one voltage is increased, said increased voltage being one or more of a said reset input voltage, said source follower voltage, said transfer gate voltage and a voltage on said node.

The arrangement may comprise at least one read transistor configured to be controlled by a read voltage, wherein during a read operation said read voltage has a read value.

At least one voltage may be increased for a period which is shorter than a period during which said read voltage has said read value.

The transfer gate voltage may in use be increased during a read operation, said transfer gate signal being changed from a first voltage level to an intermediate voltage level and then from the intermediate voltage level to a second voltage level during the read operation, the intermediate voltage level being intermediate the first and second voltage levels.

The first voltage level may be lower than said second voltage level.

The transfer gate voltage may then be changed from the second voltage level to the intermediate voltage to the first voltage level during the read operation.

The reset signal is pulsed at a beginning of said read operation.

In use said reset signal may be pulsed and said read voltage may be changed to said read value while said reset signal is pulsed.

The arrangement may comprise a capacitor, said capacitor coupled to said node and in use configured to increase said voltage on said node during said read operation.

The pixel arrangement may provide one or more pixels.

In an embodiment, a pixel arrangement comprises: a photodiode; a reset transistor configured to be controlled by a reset signal and coupled to a reset input voltage; a transfer gate transistor configured to transfer charge from the photodiode to a node, said transfer gate transistor configured to be controlled by a transfer gate voltage; a source follower transistor configured to be controlled by the voltage on the node and coupled to a source follower voltage; a pass transistor configured to be controlled by a pass control signal; and a capacitance coupled between the node and the pass control signal; wherein during a read operation, the pass control signal causes a voltage of said node to increase before said transfer gate voltage causes the transfer gate transistor to transfer charge from the photodiode to said node.

In an embodiment, a circuit comprises: a photodiode; a transfer transistor having a source-drain path coupled between the photodiode and a first intermediate node, said transfer transistor configured to be controlled by a transfer signal; a reset transistor having a source-drain path coupled between a reset voltage node and the first intermediate node, said reset transistor configured to be controlled by a reset signal; a first source follower transistor having a source-drain path coupled between a source follower voltage node and a second intermediate node, said first source follower transistor configured to be controlled by a voltage at said first intermediate node; a pass transistor having a source-drain path coupled between the second intermediate node and a third intermediate node; and a capacitance coupled between said first intermediate node and a control terminal of the pass transistor and configured, during a read operation of said photodiode, to boost voltage at said first intermediate node before said transfer signal turns on said transfer transistor.

In an embodiment, a circuit comprises: a photodiode; a transfer transistor having a source-drain path coupled between the photodiode and a first intermediate node, said transfer transistor configured to be controlled by a transfer signal; a reset transistor having a source-drain path coupled between a reset voltage node and the first intermediate node, said reset transistor configured to be controlled by a reset signal; a source follower transistor having a source-drain path coupled between a source follower voltage node and a second intermediate node, said source follower transistor configured to be controlled by a voltage at said first intermediate node; a read transistor having a source-drain path coupled between the second intermediate node and a third intermediate node, said read transistor configured to be controlled by a read signal; and a boost capacitor coupled between said first intermediate node and a control terminal of the read transistor.

In an embodiment, a circuit comprises: a photodiode; a transfer transistor having a source-drain path coupled between the photodiode and a first intermediate node, said transfer transistor configured to be controlled by a transfer signal; a reset transistor having a source-drain path coupled between a reset voltage node and the first intermediate node, said reset transistor configured to be controlled by a reset signal; a first source follower transistor having a source-drain path coupled between a source follower voltage node and a second intermediate node, said first source follower transistor configured to be controlled by a voltage at said first intermediate node; a selection transistor having a source-drain path coupled between the second intermediate node and a third intermediate node, said selection transistor configured to be controlled by a selection signal; and a boost capacitor coupled between said first intermediate node and a control terminal of the selection transistor.

In an embodiment, a pixel arrangement comprises: a first photodiode; a second photodiode; a first transfer gate transistor configured to transfer charge from the first photodiode to a sense node, said first transfer gate transistor having a control terminal configured to be controlled by a first transfer gate signal; a second transfer gate transistor configured to transfer charge from the second photodiode to a sense node, said second transfer gate transistor having a control terminal configured to be controlled by a second transfer gate signal; a reset transistor configured to reset the sense node in response to a reset signal; and a source follower transistor controlled by a voltage on the sense node; wherein each of the first and second transfer gate signals, during a read operation, has a transfer gate voltage that transitions from a first voltage level for controlling the first or second transfer gate transistor to be turned off to a second voltage level and stays at that second voltage level for a first time period causing a voltage of said sense node to increase without turning on said first or second transfer gate transistor to transfer charge from the corresponding first or second photodiode to the sense node, and then the transfer gate voltage further transitions, after the first time period, from the second voltage level to a third voltage level for controlling the first or second transfer gate transistor to be turned on and stays at that third voltage level for a second time period causing the first or second transfer gate transistor to transfer charge from the corresponding first or second photodiode to the sense node; and wherein the second voltage level is between the first and third voltage levels.

In an embodiment, a pixel arrangement comprises: a photodiode; a transfer gate transistor configured to transfer charge from the photodiode to a sense node, said transfer gate transistor having a control terminal configured to be controlled by a transfer gate signal; a reset transistor configured to reset the sense node in response to a reset signal; and a source follower transistor controlled by a voltage on the sense node; wherein the transfer gate signal, during a read operation, has a transfer gate voltage that transitions from a first voltage level for controlling the first or second transfer gate transistor to be turned off to a second voltage level and stays at that second voltage level for a first time period causing a voltage of said sense node to increase without turning on said first or second transfer gate transistor to transfer charge from the corresponding first or second photodiode to the sense node, and then the transfer gate voltage further transitions, after the first time period, from the second voltage level to a third voltage level for controlling the first or second transfer gate transistor to be turned on and stays at that third voltage level for a second time period causing the first or second transfer gate transistor to transfer charge from the corresponding first or second photodiode to the sense node; and wherein the second voltage level is between the first and third voltage levels.

An integrated circuit may comprise an arrangement described above.

BRIEF DESCRIPTION OF THE DRAWINGS

Reference is now made by way of example only to the accompanying drawings in which.

DETAILED DESCRIPTION OF THE DRAWINGS

Figure 1:
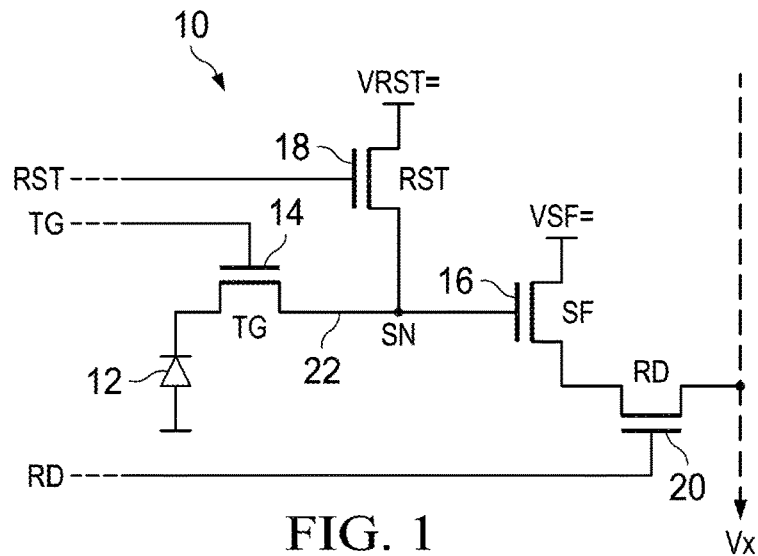
FIG. 1 shows a first example of a 4T (four transistor) pixel.

A CMOS image sensor has a pixel array. FIG. 1 shows a common pixel architecture, based on what is known as a 4T (four transistor) pixel 10. The pixel 10 comprises a photodiode 12, a transfer gate transistor 14, a source follower transistor 16, a reset transistor 18 and a read transistor 20. These transistors act to reset, expose and then read out data from the photodiode. The transfer gate transistor 14 is controlled by a signal TG, the reset transistor 18 is controlled by a signal RST and the readout transistor 20 is controlled by the read signal RD. The source follower transistor 16 has its gate tied to a sense node (SN) 22.

In more detail, the reset transistor 18 receives the reset signal RST at its gate, its drain is connected to a voltage VRST and its source is connected to the sense node 22. The source follower transistor 16 has its drain connected to a source follower supply voltage VSF and its source connected to the drain of the read transistor 20. The read signal RD is coupled to the gate of the read transistor 20. The source of the read transistor 20 provides the output voltage Vx. The transfer gate transistor 14 has its gate coupled to the control signal TG. The drain of the transfer gate transistor is connected to the sense node 22 while its source is connected to the photodiode 12.

The transistors typically operate with a pinned photodiode structure and Correlated Double Sampling (CDS) to remove "kTC" noise associated with the reset operation. In Correlated Double Sampling, the output of the pixel is measured twice: once in a reset condition (in this case at "black level" when the only level change is resultant from noise) and once in a condition including the signal (which still includes the "black level" noise). The value measured from the signal condition is then subtracted from the reset condition so as to remove the "black level" noise offset. The double sampling operation also removes fixed noise sources such as variation in the threshold voltage of the source follower transistor.

The pixel needs to have appropriate voltage levels applied at defined time intervals. The voltage levels of the control signal TG (to transfer the pixel signal level to the sense node), RST (to reset the sense node and photodiode) and RD (or READ) (to read/select the pixel to the Vx line) as well as the pixel power supply (providing VRST and VSF), should comprise little noise, since any noise may couple directly to the sense node or column parallel output voltage level Vx and corrupt the image data.

The amount of charge that a photodiode can collect before saturating is known as the full well. It is desirable to have a large full well so that many photons can be collected from the incoming illumination and the imaging range extended. During the pixel read operation the collected charge is transferred to the sense node which causes a downward voltage change (of which the magnitude is determined by the capacitance on the sense node). A large voltage change per electron transferred (known as conversion factor) is desirable to maximize the signal swing but if the transferred charge is large, the full voltage swing may not be achieved. Limitations can come from one or more of the following (but are not limited to):

1. A requirement to have a sense node voltage above the pinning voltage of the photodiode. If the sense node voltage is too low, full charge transfer will not occur and signal will be lost.

2. Limited swing available on the Vx column. If the sense node voltage is too low the source follower may not be able to correctly buffer the sense node voltage. The Vx voltage lower limit may be dictated by the column current source which requires a voltage drop to operate correctly.

It is thus desirable in some embodiments to maximize the blk level of the sense node. This blk level is the voltage after the RESET transistor has been turned OFF and before the TG signal is pulsed. It may be desirable to maximize the change in the sense node and Vx voltage.

The reset signal will typically vary between the low and high levels.

Figure 2:
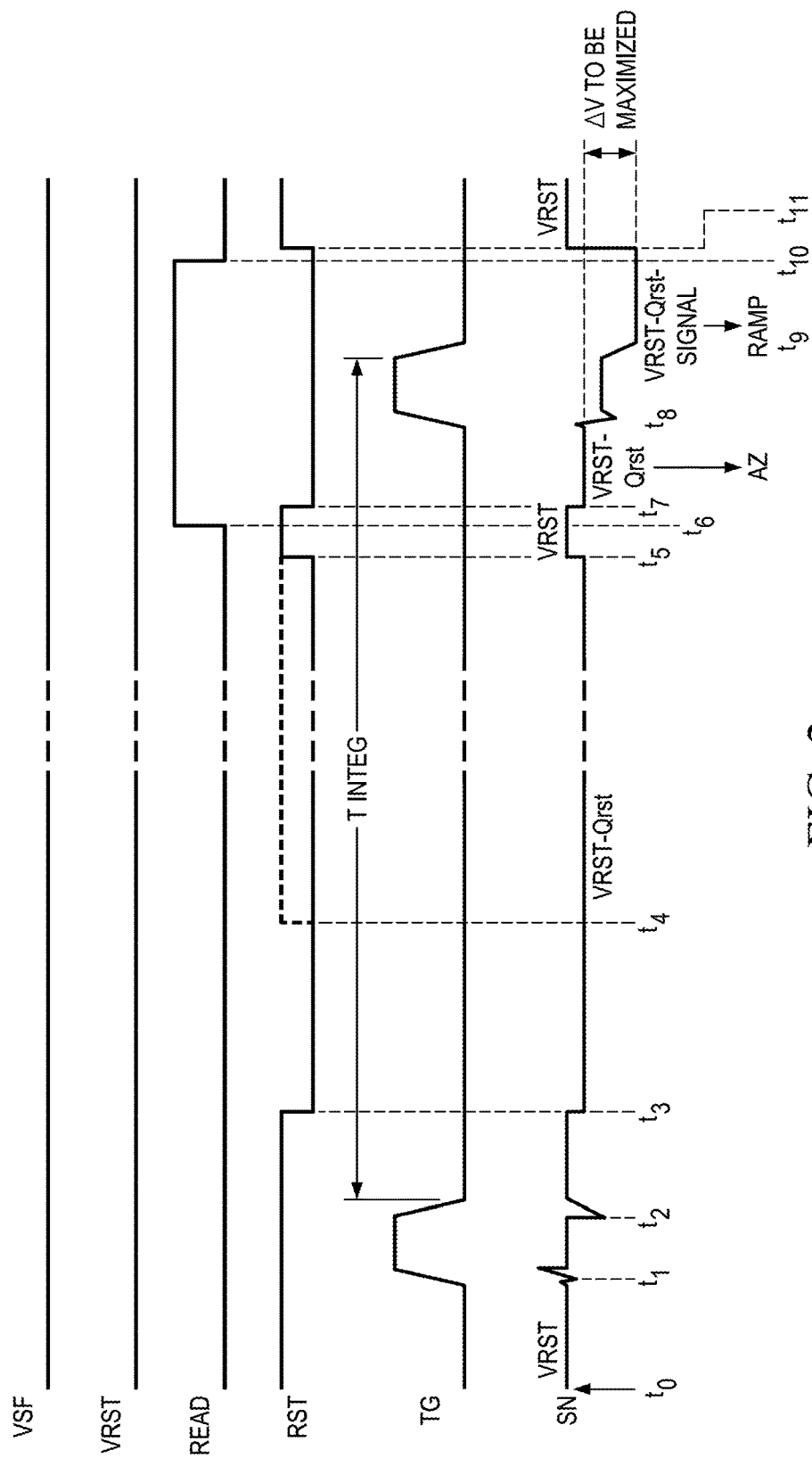
FIG. 2 shows a timing diagram for the pixel of FIG. 1.

Reference is made to FIG. 2 which shows the voltage of the different signals over time.

The voltage VSF is held at a first voltage. The reset voltage VRST is held at second voltage.

Initially, at time t0, the read signal READ is held at third, non-read voltage. In the time period t0 to t1, the signal TG is at a fourth voltage which may be a negative voltage in some embodiments. At time t1, the TG signal is taken up to fifth voltage which is higher than the fourth voltage and then back down to the fourth voltage at time t2. The voltage on the SN is initially VRST. There will be a voltage spike in the voltage on node SN corresponding to the signal TG toggling up to the fifth voltage level. There is a corresponding downward spike on node SN when the voltage TG is returned back to the fourth voltage level.

The RST signal is initially at a sixth voltage and is then dropped at time t3 to a seventh voltage level. In some embodiments, the RST signal is optionally returned to the sixth voltage level at time t4. From time t3 to t5, the voltage on the SN is VRST-Qrst. The integration period in this embodiment is from time t2 to time t9.

At time t5 the RST signal and just beyond at time t6 the READ signal are respectively raised to higher voltage levels, that is the sixth voltage level in the case of the RST signal and a eighth voltage level in the case of the READ signal. This starts the read period of the pixel. The RST signal is then set to its low level, the seventh voltage level at time t7. Again, the voltage on the SN node will drop to VRST-Qrst.

At time t8 the TG signals increase to the fifth voltage which turns on the TG device causing a positive coupling onto the sense node. The upward coupling will be in opposition to any downward voltage shift caused by the charges transferred from the photodiode. When the TG voltage toggles back down at time t9, the voltage on the SN node couples downward reversing the previous upward kick. The voltage is VRST-Qrst-signal.

At time t10 and t11 the column voltage has been converted by an on-chip ADC so the read signal is set to the lower voltage, the third voltage, and the RST signal set to the higher voltage, the sixth voltage to disable the pixel. The voltage on the node SN will increase to VRST. The reference to ΔV represents the signal voltage. It is this voltage which some embodiments aim to maximize.

In this example, the signal RST is low during the integration time. In other arrangements, this signal could be high during the integration time.

Figure 3:
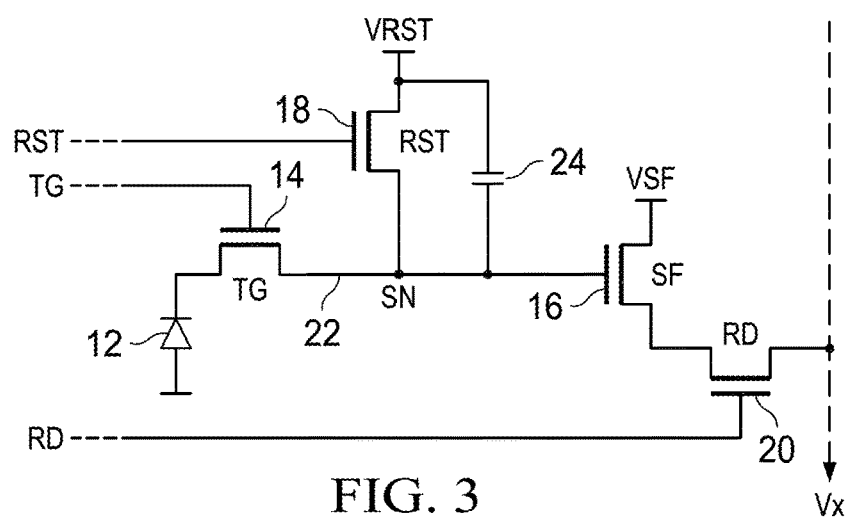
FIG. 3 shows a second example of a 4T (four transistor) pixel.

Reference is now made to FIG. 3 which shows a second example of a 4T pixel. It should be appreciated that those parts which are the same as in FIG. 1 are referred to with the same reference number. In this arrangement, a capacitor 24 is provided in parallel with the reset transistor 18. This capacitor may be capacitance inherent in the arrangement. In some embodiments, the capacitance may be increased by the way in which the pixel is constructed (i.e., using a capacitor circuit). Otherwise the arrangement is as shown in FIG. 1.

Figure 4:
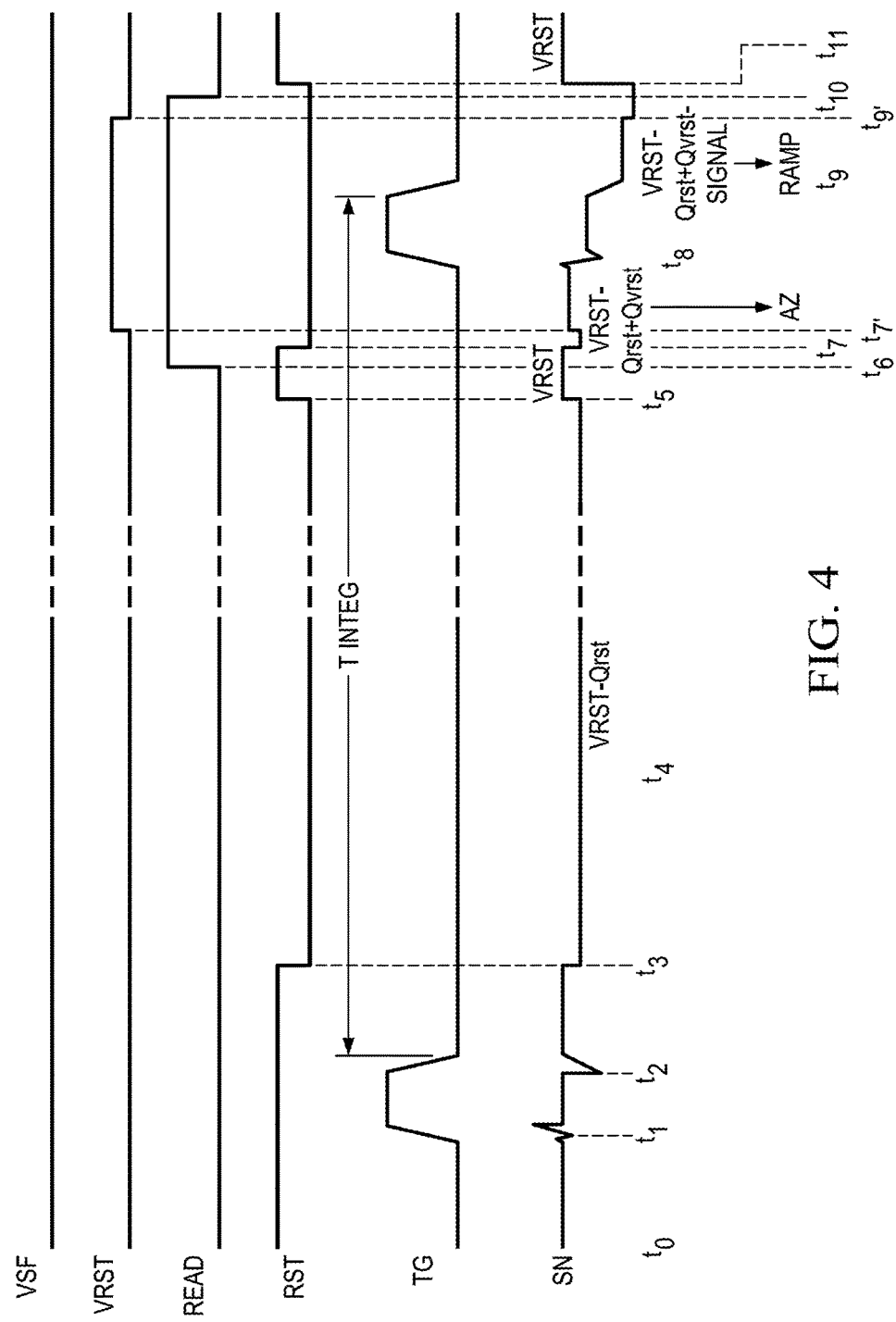
FIG. 4 shows a timing diagram for the pixel of FIG. 3.

Reference is now made to FIG. 4 which shows the corresponding timing for the circuitry of FIG. 3. It should be appreciated that there is a correspondence in the events at times t0, t1, t2, t3, t4, t5, t6, t7, t8, t9, t10, and t11 between FIGS. 2 and 4. Accordingly, these events will not be described again.

At time t7' (between times t7 and t8), the voltage VRST is increased to a ninth voltage level until time t9' (between times t9 and t10) when it is returned to the second voltage level. The voltage on the node SN will be VRST-Qrst+Qvrst at time t7'. VRST is returned to the second level before the read voltage drops to the third voltage level. However, it should be appreciated that the voltage between times t9 and t9' on the SN node will be VRST-Qrst+Qvrst-signal. There will thus be more headroom available for signal as compared to FIG. 2. To improve the effect of boosting, the capacitor 24 can be increased in size.

Figure 5:
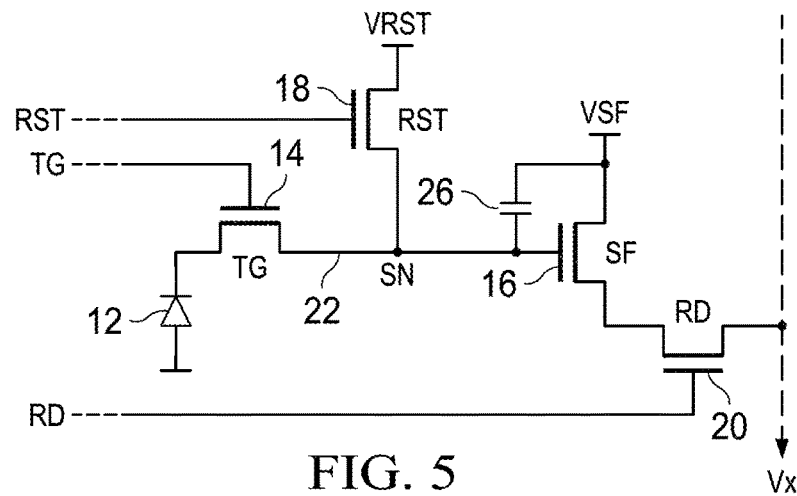
FIG. 5 shows a third example of a 4T (four transistor) pixel.
Figure 6:
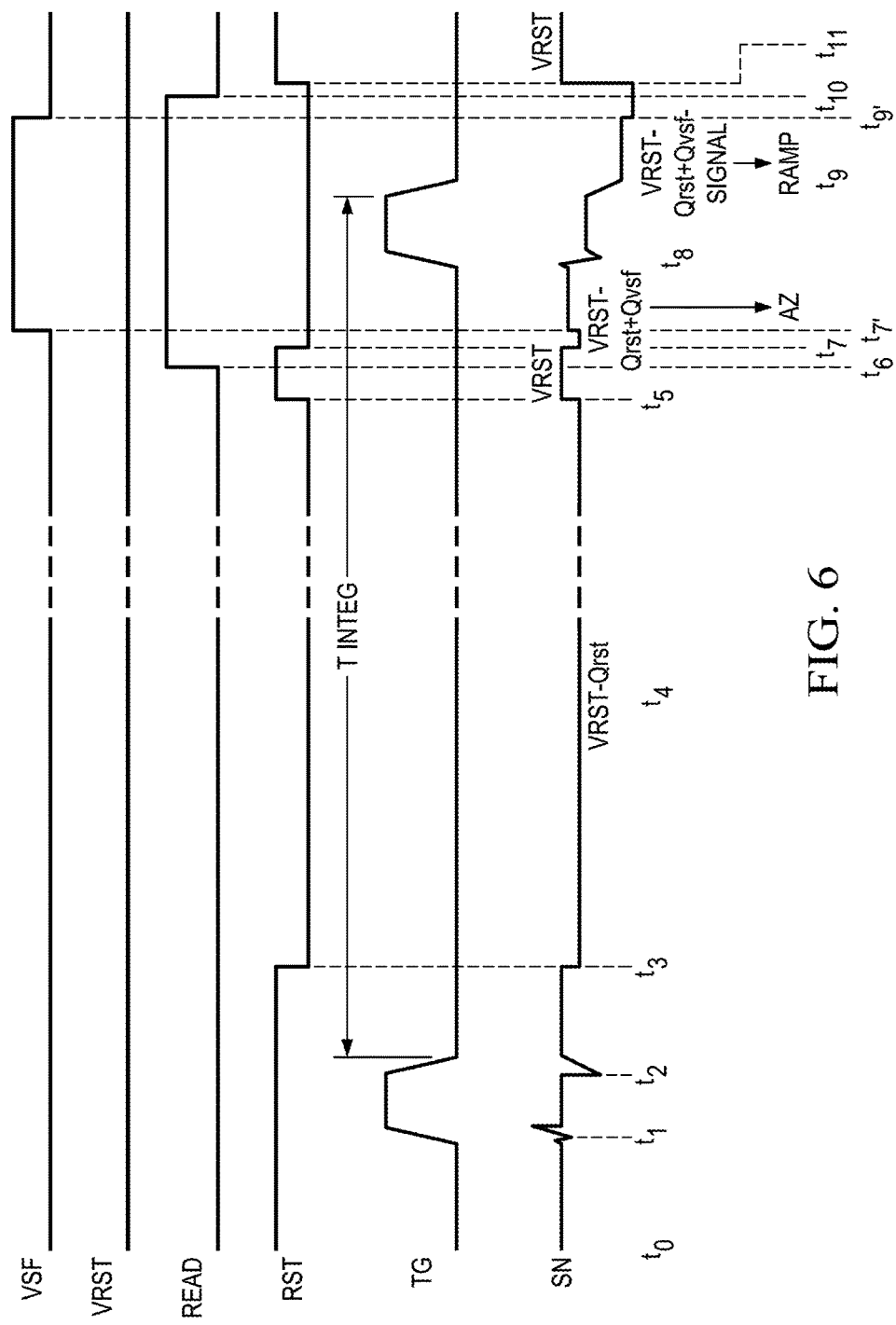
FIG. 6 shows a timing diagram for the pixel of FIG. 5.

Reference is made to FIGS. 5 and 6 which show another embodiment. FIG. 5 shows the circuitry. The circuitry is as shown in FIG. 1 but a capacitor is shown between VSF and the node SN. This capacitor is referenced 26 and may be inherent and optionally augmented by a metal arrangement (capacitor circuit) in the layout.

FIG. 6 shows the timing for the circuit of FIG. 5. It should be appreciated that there is a correspondence in the events at times t0, t1, t2, t3, t4, t5, t6, t7, t8, t9, t10, and t11 between FIGS. 2 and 6. Accordingly, these events will not be described again and the differences with respect to the timing of FIG. 2 will now be discussed. The voltage VSF voltage is held at a tenth voltage level which is lower than the first voltage level of FIG. 2. The VSF voltage is increased up to the first voltage level at time t7' (between time t7 and t8) and reduced back to the tenth voltage level at time t9' (between time t9 and t10). This timing is the same as used in the arrangement of FIGS. 3 and 4 with respect of the increasing of the voltage VRST, but for the VSF voltage. The voltage on the node SN at times t9 to t9' is VRST-Qrst+Qvsf-signal. Again, the headroom available for signal is increased with respect to the arrangement of FIG. 1.

Figure 7:
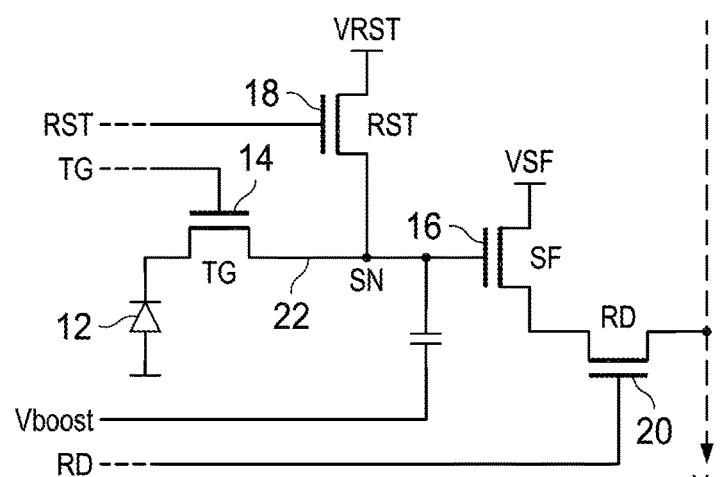
FIG. 7 shows a fourth example of a 4T (four transistor) pixel.
Figure 8:
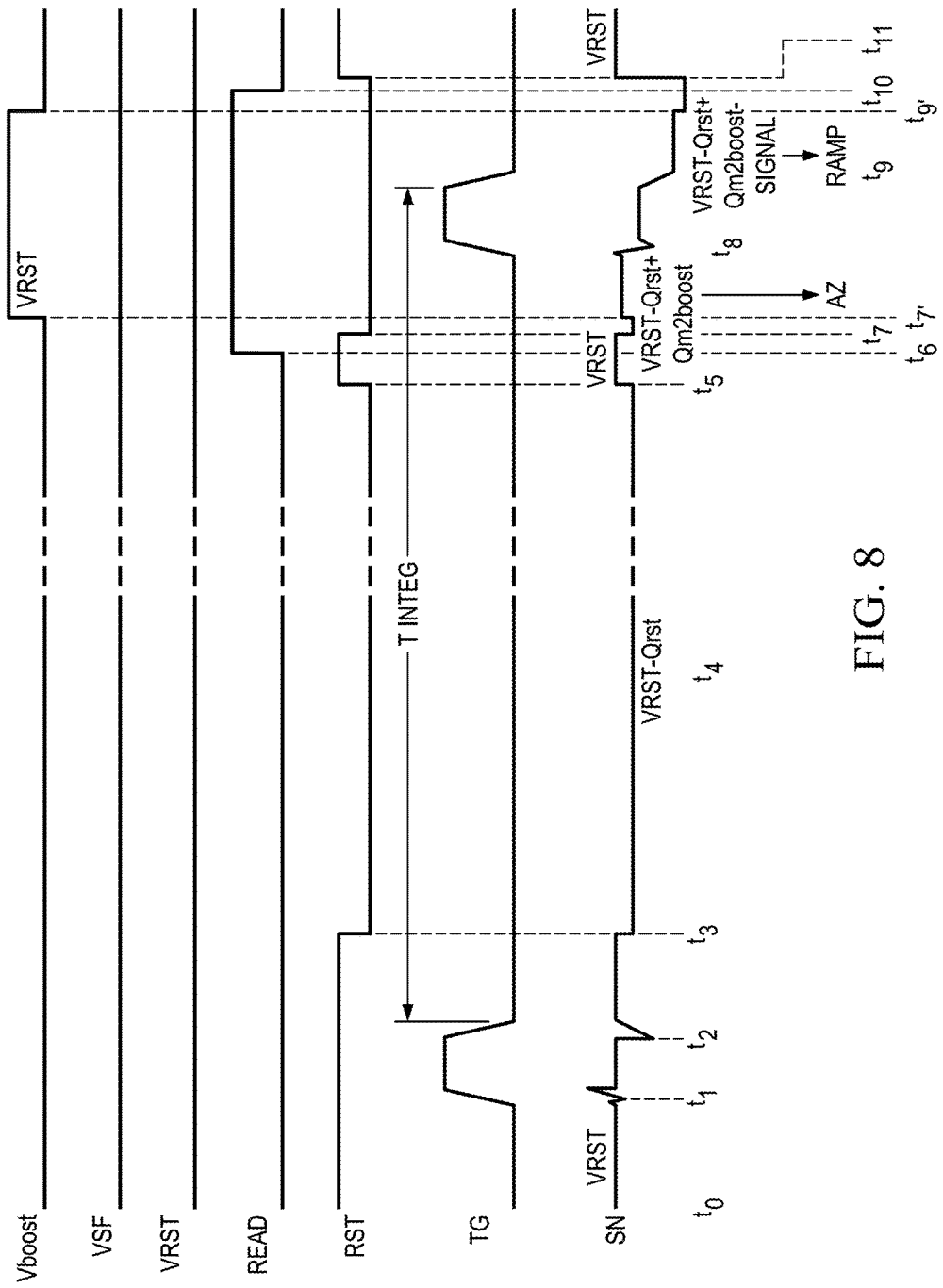
FIG. 8 shows a timing diagram for the pixel of FIG. 7.

Reference is made to FIGS. 7 and 8 which show another embodiment. The circuitry is shown in FIG. 7 and differs from the arrangement of FIG. 1 in that a capacitor 27 is shown between the sense node SN and a boost voltage, referred to Vboost. The capacitor is provided by the layout of metal. The timing associated with this arrangement is shown in FIG. 8.

FIG. 8 shows the timing for the circuit of FIG. 7. It should be appreciated that there is a correspondence in the events at times t0, t1, t2, t3, t4, t5, t6, t7, t8, t9, t10, and t11 between FIGS. 2 and 8. Accordingly, these events will not be described again and the differences with respect to the timing of FIG. 2 will now be discussed. The Vboost signal follows the same pattern as the VRST of FIG. 4. The Vboost signal voltage varies between an eleventh voltage and a higher twelfth voltage. The twelfth voltage level may be the second voltage level of VRST. At time t7', Vboost increases from the eleventh voltage level to the twelfth voltage level and decreases back to the eleventh voltage level at time t9'

The voltage on the node SN at times t9 to t9 is VRST-Qrst+QVboost-signal. Again, the headroom for signal is increased with respect to the arrangement of FIG. 1.

Figure 9:
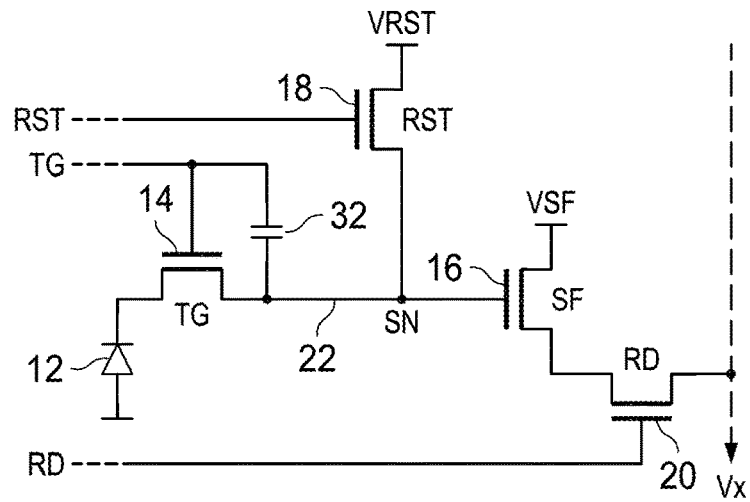
FIG. 9 shows a fifth example of a 4T (four transistor) pixel.

Reference is made to FIG. 9 where a capacitor 32 is shown between TG and the node SN. The capacitor is inherent in some embodiments and in other embodiments may be augmented by metal of the layout. The timing associated with this arrangement is shown in FIG. 10.

Figure 10:
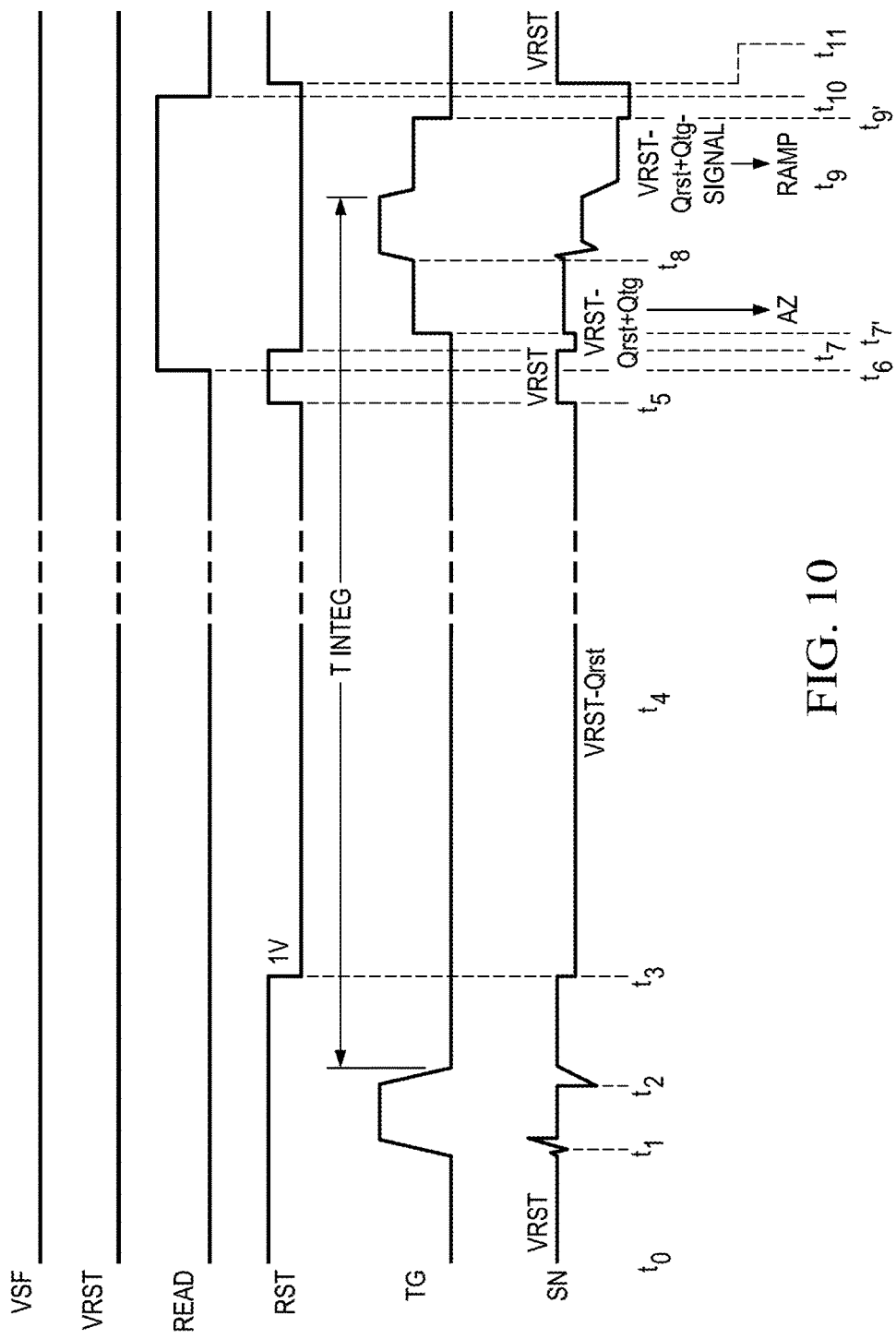
FIG. 10 shows a timing diagram for the pixel of FIG. 9.

FIG. 10 shows the timing for the circuit of FIG. 9. It should be appreciated that there is a correspondence in the events at times t0, t1, t2, t3, t4, t5, t6, t7, t8, t9, t10, and t11 between FIGS. 2 and 10. Accordingly, these events will not be described again and the differences with respect to the timing of FIG. 2 will now be discussed. The TG signal can now be set to three different voltage levels. This permits both boosting and charge transfer to be controlled from the same signal—TG. The boosting operation is shown in FIG. 10 at time t17' where the TG voltage is increased from a fourth voltage to an intermediate voltage level between the fourth and fifth voltage levels. The intermediate voltage may vary depending on how much boosting is required and/or what the process defines to be the maximum level that does not transfer charge to the sense node from the photodiode. After the boost has been applied, the blk level is sampled at node Vx. The transfer pulse on TG is made between t8 and t9. The difference from previous embodiments is that the TG voltage starts at the intermediate voltage level at time t8 and returns to the intermediate voltage level at time t9. The TG voltage level decreases from the intermediate level to the fourth voltage level at time t9'.

In this embodiment, the voltage on node SN between times t7' and t8 is VRST-Qrst+Qtg. Qtg is the charge on the capacitor 27. This is also the blk sampling period.

The voltage on the node SN at times t9 to t9' is VRST-Qrst+Qtg-signal. This is the signal sampling period. Again, the headroom available for signal is increased with respect to the arrangement of FIG. 1.

As mentioned previously, it is desirable to have a low capacitance on the node SN to have a high conversion factor. FIG. 9 and FIG. 10 have described an arrangement in which the inherent overlap capacitance of the TG transistor can be used to boost the sense node voltage.

The above described embodiments have used four n-type transistors. It should be appreciated that in other embodiments, the transistors may be p type transistors or a mix of at least one n type transistor and at least one p type transistors.

Figure 11:
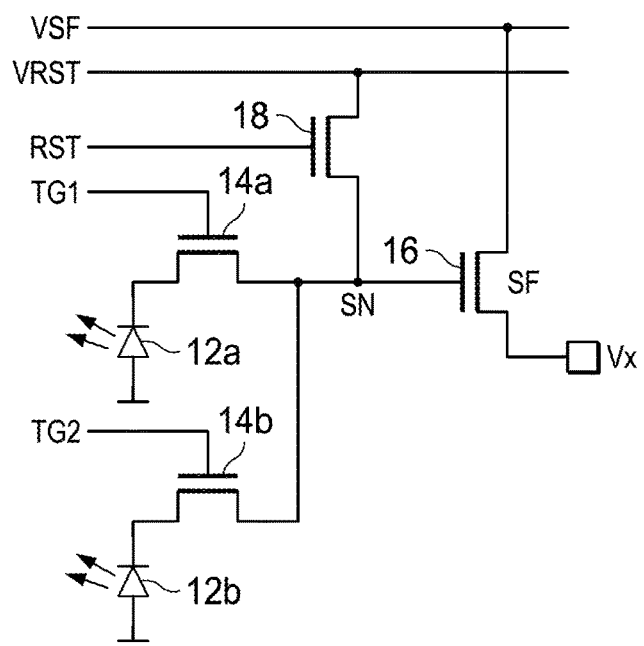
FIG. 11 shows a two transistor pixel.

The above embodiments have been described in relation to a 4T pixel. It should be appreciated that embodiments may be used with other structures of pixels. By way of example, reference is made to FIG. 11 which shows a 2T pixel. In the arrangement shown in FIG. 11, there are four transistors which are used to provide two pixels, thus giving two transistors per pixel. In the arrangement shown in FIG. 11, a first photo diode 12a and a second photo diode 12b are shown. Each of these diodes is coupled to a respective transfer gate transistor 14a and 14b. A single reset transistor 18 is used for both of the pixels. Likewise, a single source follower transistor 16 is shown. In this arrangement, there is no read transistor. It should be appreciated that in the arrangement of FIG. 11, one or more of the following may occur:

the VRST voltage may be controlled as shown in FIG. 4;
the VSF voltage may be controlled as shown in FIG. 6;
a boost voltage can be applied to a capacitor as described in relation to FIGS. 7 and 8;
the TG voltage can be controlled as described in relation to FIG. 10.

Figure 12:
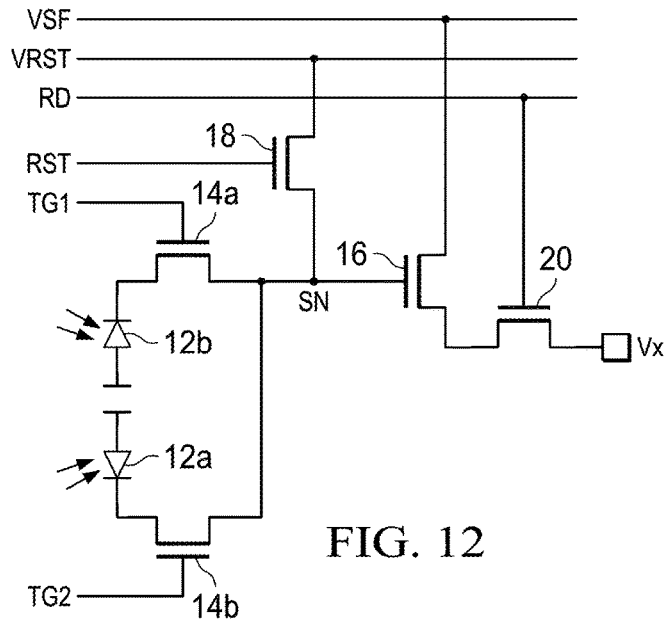
FIG. 12 shows a 2.5 transistor pixel.

Reference is made to FIG. 12 which shows a 2.5 T pixel. Five transistors are used to provide two pixels giving 2.5 transistors per pixel. The arrangement is as described in relation to FIG. 11 but with the addition of the read transistor 20. One or more of the voltages can be boosted as described previously.

Figure 13:
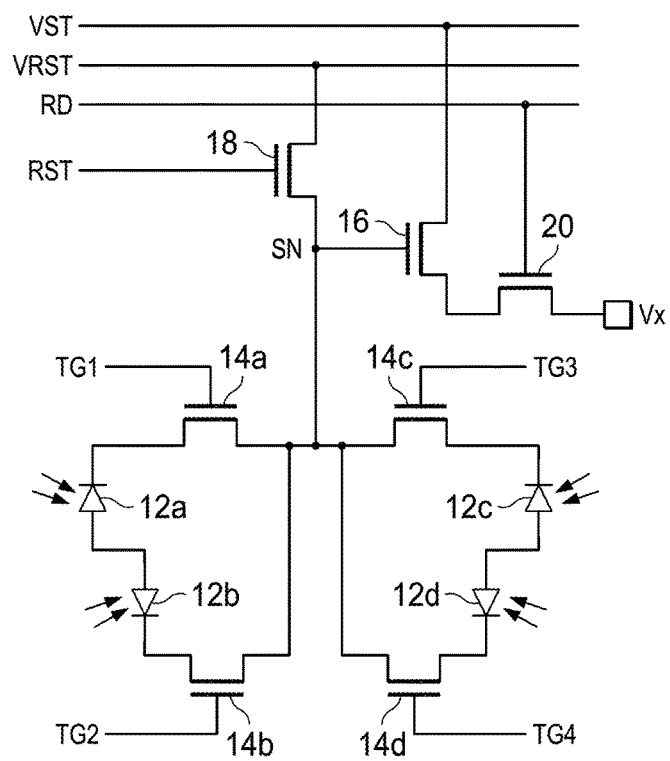
FIG. 13 shows a 1.75 transistor pixel.

Reference is made to FIG. 13 which shows a 1.75T pixel. In this arrangement, there were seven transistors providing four pixels, giving 1.75 transistors per pixel. There are four photodiodes 12a, 12b, 12c and 12d. Each photodiode is provided with a respective transfer gate transistor 14a, 14b, 14c and 14d. A single reset transistor 18, source follower transistor 16 and read transistor 20 are provided. Again, any of the voltages previously described as having been boosted can be boosted in the arrangement of FIG. 13.

Whilst examples of 2T, 1.75T and 2.5T arrangements have been shown, it should be appreciated that this is by way of example only. Other embodiments may be used with other transistor structures, for example 5T etc.

Figure 15:
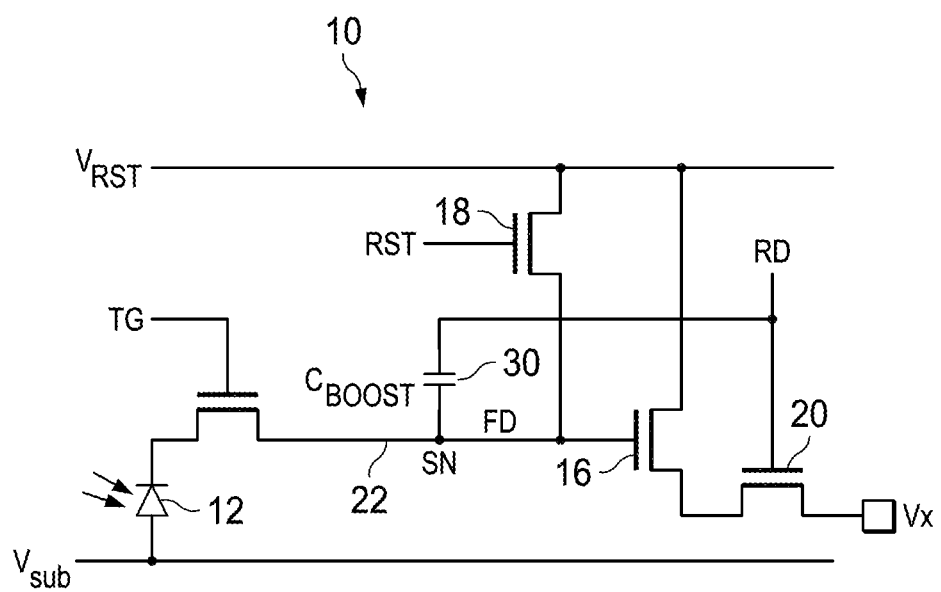
FIG. 15 shows a further example of a 4T pixel.

Reference is made to FIG. 15 which shows a further example of a 4T pixel. It should be appreciated that those parts which are the same as in FIG. 1 are referred to with the same reference number. In this arrangement, a capacitor 30 is provided between the gate of the read transistor 20 and the sense node 22. The capacitor is inherent in some embodiments and in other embodiments may be augmented by metal of the layout. In some embodiments, the capacitance is provided by a metal fringe capacitor. The source follower transistor 16 has its drain connected to the voltage VRST. In other embodiments, the source follower transistor may be arranged as shown in FIG. 1. Otherwise the arrangement is as shown in FIG. 1.

Figure 16:
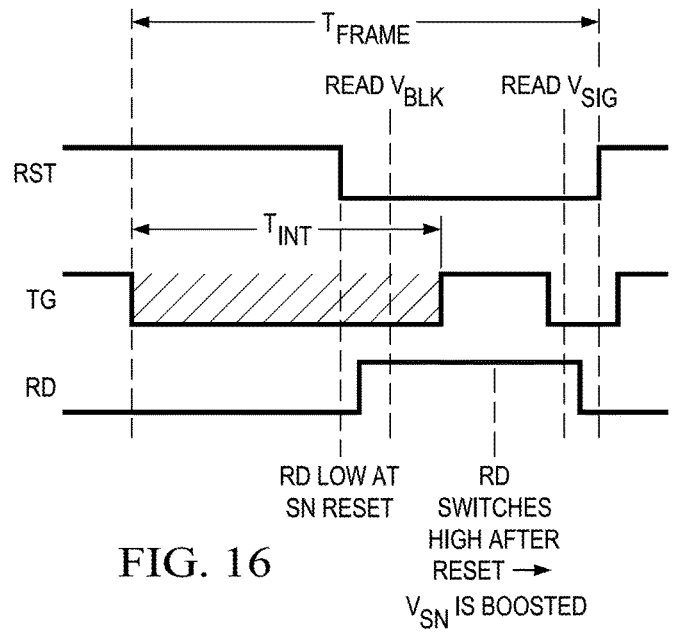
FIG. 16 shows a timing diagram for the pixel of FIG. 15.

A simplified timing diagram is shown in FIG. 16 for the pixel of FIG. 15. FIG. 16 shows the RST signal, the TG signal and the RD signal. When the RST signal goes low, which resets SN node, the RD signal is low as is the TG signal. The read signal then goes high, the RST and TG signals being low. The black level measurement is then made. The TG signal then goes high and the second pixel measurement is made. The TG signal then goes low again. The RD signal then goes low, followed by the RST signal going high. The RD signal will be thus be switched high after reset and because of the capacitor 30, the voltage on the sense node is boosted.

Figure 17:
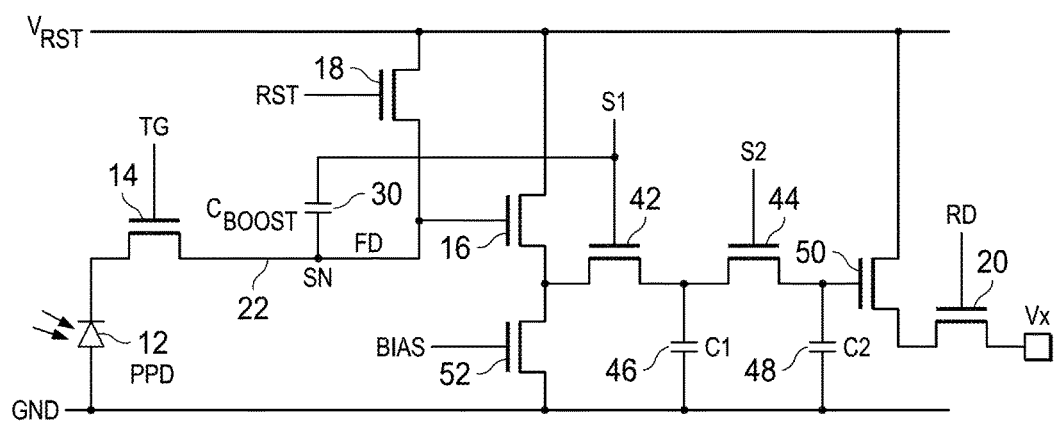
FIG. 17 shows an example of a 8T pixel.

Reference is made to FIG. 17 which shows an 8T global shutter pixel. The 8T global shutter pixel has four pixels as described in relation to the 4T pixel. The transfer gate transistor 14, the reset transistor 18 and the source follower transistor 16 are arranged as described in FIG. 15. The source follower transistor is arranged with its source coupled to ground via a fifth, bias, transistor 52 which receives a bias voltage as a control input. The source of the source follower transistor 16 is coupled to the gate of a sixth transistor 50 via two further transistors, a seventh transistor 42 and an eighth transistor 44, arranged in series. The gate of the seventh transistor 42, is arranged in series receives a first control signal S1 while the eighth transistor 44 receives a second control signal S2 as its gate input. A first capacitor 46 is arranged between a node between the seventh and eighth transistors and ground. A second capacitor 48 is arranged between a node between the eighth transistor 44 and the gate of the transistor 50, and ground 40. The drain of the sixth transistor 50 is connected to the reset voltage VRST and its source is connected to the drain of the read transistor 20.

The seventh transistor 42 and the first capacitor 46 are considered to be a first storage stage while transistor 44 and 40 and the capacitor 48 are considered as a second storage stage. The transistor 50 can be considered to act as a buffer amplifier.

Figure 18:
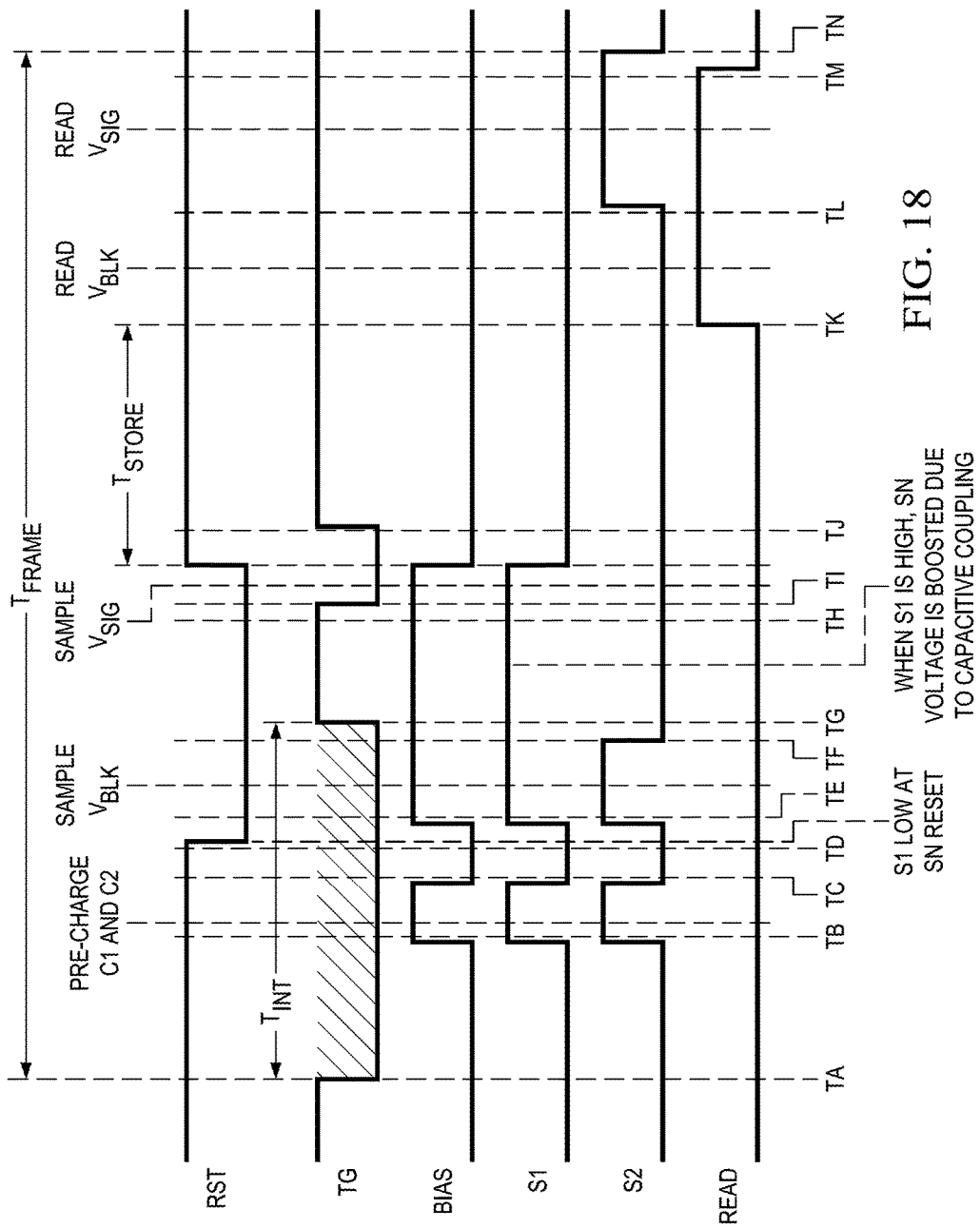
FIG. 18 shows a timing diagram for the pixel of FIG. 17.

A simplified timing diagram is shown in FIG. 18 for the pixel of FIG. 17. FIG. 18 shows the RST signal, the TG signal, the BIAS signal, the S1 signal, the S2 signal and the READ signal. Initially the RST and TG signals are high and the remaining signals are low. At $T_A$ the TG goes low starting the integration period wherein charge is accumulated in the photodiode. At $T_B$ the BIAS, S1 and S2 signals go high and then low at $T_C$. The RST signal then goes low at $T_D$. The BIAS, S1 and S2 signals then go high at $T_E$ and the black level is sampled and $V_{BLK}$ is stored in second capacitor 48. During this black level sampling the S1 signal is high and accordingly the SN voltage is boosted due to the capacitive coupling. The S2 signal goes low at $T_F$. The TG signal then goes high at $T_G$, ending the integration period. At this point, the signal is sampled and $V_{SIG}$ is stored in first capacitor 46. TG then goes high at $T_H$ and the signal sampling stops. At $T_I$, the BIAS, S1 and S2 signals go low and at $T_J$ the TG signal goes high. At $T_K$, the READ signal goes high and the voltage $V_{BLK}$ stored in second capacitor 48 is read. Then S2 goes high at $T_L$ and voltage $V_{SIG}$ stored in first capacitor 46 is read. The READ signal then goes low at $T_M$ followed by the S2 signal at $T_N$.

Some embodiments may provide a boost solution which does not require the use of additional control signals. This may be advantageous in the devices with small pixel pitches.

Some embodiments may thus use capacitive coupling of the sense node to one or more existing control signals in order to increase the available voltage swing on the sense node. Some of the previous embodiments use this capacitive coupling.

An increased sense node voltage may also improve charge transfer efficiency from the photodiode to the sense node because of the greater potential gradient between the two which results from the voltage boost.

Signal timing may be such that when the sense node is reset, the control signal providing the boost is low. After the sense node has been reset, the control signal may switch high. If the pixel has a capacitance between the control signal and the sense node will yield a voltage-boosting effect when combined with the aforementioned signal timing. The increase in voltage ($V_{BOOST}$) and the effect of the boost capacitance on the conversion factor (CVF) may be defined by:

$$V_{BOOST} = \frac{C_{BOOST}}{C_{SN} + C_{BOOST}} V_{CTRL}$$

$$CVF = \frac{q_{e-}}{C_{SN} + C_{BOOST}}$$

In some embodiments, the sense node capacitance ($C_{SN}$) may be typically ~1 fF to 5 fF. This means that $C_{BOOST}$ does not need to be large and can be provided in small pixels. The capacitance may be provided by way of example only by a metal fringe capacitor.

The sense node voltage range may be limited at the upper and lower ends by different constraints. With a 4T-type pixel, the upper limit of the sense node voltage range may be typically set by the power supply voltage, whereas the lower limit may be determined by the depletion potential of the photodiode and the threshold voltage of the source follower transistor.

With some 4T style pixel architectures, as the reset transistor is turning off, a portion of the charge forming the channel will be injected onto the sense node, causing its voltage to decrease. This charge injection may result in a voltage decrease in the region of 100 mV to 200 mV. This creates a convenient target to use for determining the required $V_{BOOST}$, and for typical operating voltages, will result in a $C_{SN}$:$C_{BOOST}$ ratio of ~10:1, which preserves CVF while compensating for the reset transistor charge injection.

The above described embodiments have been described in relation to MOS transistors. It should be appreciated that in other embodiments, different types of transistors have been used.

Figure 14:
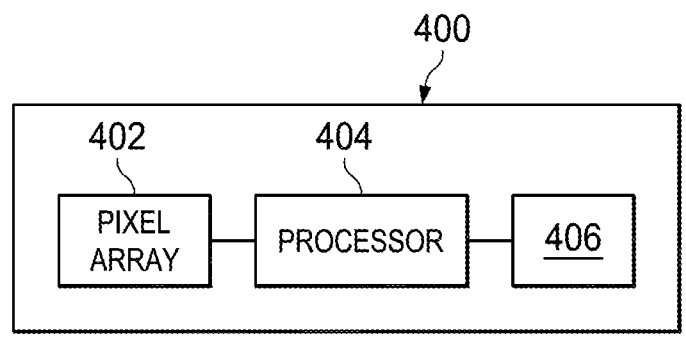
FIG. 14 shows a device.

Some embodiments may be provided in a device 400 such as shown in FIG. 14. The device 400 may comprise any one of arrangements as previously described which are referenced 402. An output from the pixel array may be provided to a processor 404. The output of the processor may control for example a display 406 and allow the captured image to be displayed, It should be appreciated that the device may be any suitable device. By way of example only and without limitation, that device may be a mobile telephone, smart phone, tablet, computer, camera or the like Various embodiments with different variations have been described here above. It should be noted that those skilled in the art may combine various elements of these various embodiments and variations. Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

What is claimed is:

1. A pixel arrangement, comprising:
   a photodiode;
   a transfer gate transistor configured to transfer charge from the photodiode to a sense node, said transfer gate transistor having a control terminal configured to be controlled by a transfer gate signal;
   a reset transistor configured to reset the sense node in response to a reset signal; and
   a source follower transistor controlled by a voltage on the sense node;
   wherein the transfer gate signal, during a read operation, has a transfer gate voltage that transitions from a first voltage level for controlling the transfer gate transistor to be turned off to a second voltage level and stays at that second voltage level for a first time period causing a voltage of said sense node to increase without turning on said transfer gate transistor to transfer charge from the photodiode to the sense node, and then the transfer gate voltage further transitions, after the first time period, from the second voltage level to a third voltage level for controlling the transfer gate transistor to be turned on and stays at that third voltage level for a second time period causing the transfer gate transistor to transfer charge from the photodiode to the sense node; and wherein the second voltage level is between the first and third voltage levels.

2. The pixel arrangement of claim 1, wherein the source follower outputs the voltage at the sense node while the transfer gate voltage is at the second voltage level as a first sampled voltage and wherein the source follower outputs the voltage at the sense node after the transfer gate voltage is at the third voltage level as a second sampled voltage.

3. The pixel arrangement of claim 2, further comprising a read transistor coupled between the source follower transistor and an output, wherein said read transistor is controlled to turn on to pass the first sampled voltage for output and to pass the second sampled voltage for output.

4. The pixel arrangement of claim 2, wherein said transfer gate voltage further transitions, after the second time period, from the third voltage level to a fourth voltage level and stays at said fourth voltage level for a third time period during which the second sampled voltage is output, and then transitions, after the third time period, from the fourth voltage level to the first voltage level, and wherein the fourth voltage level is between the first and second voltage levels.

5. The pixel arrangement of claim 2, wherein said reset signal is pulsed at a beginning of said read operation.

6. The pixel arrangement of claim 2, wherein said reset signal is pulsed while the first and second sampled voltages are output.

7. The pixel arrangement of claim 1, wherein the pixel arrangement is implemented as an integrated circuit.

8. The pixel arrangement of claim 1, further comprising:
a further photodiode;
a further transfer gate transistor configured to transfer charge from the further photodiode to a sense node, said further transfer gate transistor having a control terminal configured to be controlled by a further transfer gate signal;
wherein each of said transfer gate signal and said further transfer gate signal have said transfer gate voltage.

9. A pixel arrangement, comprising:
a first photodiode;
a second photodiode;
a first transfer gate transistor configured to transfer charge from the first photodiode to a sense node, said first transfer gate transistor having a control terminal configured to be controlled by a first transfer gate signal;
a second transfer gate transistor configured to transfer charge from the second photodiode to a sense node, said second transfer gate transistor having a control terminal configured to be controlled by a second transfer gate signal;
a reset transistor configured to reset the sense node in response to a reset signal; and
a source follower transistor controlled by a voltage on the sense node;
wherein each of the first and second transfer gate signals, during a read operation, has a transfer gate voltage that transitions from a first voltage level for controlling the first or second transfer gate transistor to be turned off to a second voltage level and stays at that second voltage level for a first time period causing a voltage of said sense node to increase without turning on said first or second transfer gate transistor to transfer charge from the corresponding first or second photodiode to the sense node, and then the transfer gate voltage further transitions, after the first time period, from the second voltage level to a third voltage level for controlling the first or second transfer gate transistor to be turned on and stays at that third voltage level for a second time period causing the first or second transfer gate transistor to transfer charge from the corresponding first or second photodiode to the sense node; and
wherein the second voltage level is between the first and third voltage levels.

10. The pixel arrangement of claim 9, wherein the source follower outputs the voltage at the sense node while the transfer gate voltage is at the second voltage level as a first sampled voltage and wherein the source follower outputs the voltage at the sense node after the transfer gate voltage is at the third voltage level as a second sampled voltage.

11. The pixel arrangement of claim 10, further comprising a read transistor coupled between the source follower transistor and an output, wherein said read transistor is controlled to turn on to pass the first sampled voltage for output and to pass the second sampled voltage for output.

12. The pixel arrangement of claim 10, wherein said transfer gate voltage further transitions, after the second time period, from the third voltage level to a fourth voltage level and stays at said fourth voltage level for a third time period during which the second sampled voltage is output, and then transitions, after the third time period, from the fourth voltage level to the first voltage level, and wherein the fourth voltage level is between the first and second voltage levels.

13. The pixel arrangement of claim 10, wherein said reset signal is pulsed at a beginning of said read operation.

14. The pixel arrangement of claim 10, wherein said reset signal is pulsed while the first and second sampled voltages are output.

15. The pixel arrangement of claim 9, wherein the pixel arrangement is implemented as an integrated circuit.

* * * * *

UNITED STATES PATENT AND TRADEMARK OFFICE
CERTIFICATE OF CORRECTION

PATENT NO. : 10,283,559 B2  
APPLICATION NO. : 15/640968  
DATED : May 7, 2019  
INVENTOR(S) : Graeme Storm et al.

Page 1 of 1

It is certified that error appears in the above-identified patent and that said Letters Patent is hereby corrected as shown below:

In the Specification

Column 9, Line 33, replace [[ $T_1$ ]] with -- $T_I$ --

Signed and Sealed this  
Tenth Day of March, 2020

Andrei Iancu  
*Director of the United States Patent and Trademark Office*